(12) United States Patent
Lee et al.

(10) Patent No.: US 12,427,603 B2
(45) Date of Patent: Sep. 30, 2025

(54) SOLAR PANEL DISASSEMBLY DEVICE AND SOLAR PANEL DISASSEMBLY METHOD USING THE SAME

(71) Applicant: WON KWANG S&T CO., LTD., Incheon (KR)

(72) Inventors: Sang Hun Lee, Incheon (KR); Jun Kee Kim, Seoul (KR); Min Hwang, Incheon (KR); Cheong Min Noh, Incheon (KR); Byeol I Im, Incheon (KR); Seung Seop Jo, Incheon (KR); Do Yun Lee, Incheon (KR); Kwang Min Seo, Incheon (KR); Dae Sik Youn, Incheon (KR)

(73) Assignee: WON KWANG S&T CO., LTD., Incheon (KR)

( * ) Notice: Subject to any disclaimer, the term of this patent is extended or adjusted under 35 U.S.C. 154(b) by 0 days.

(21) Appl. No.: 18/908,287

(22) Filed: Oct. 7, 2024

(65) Prior Publication Data
US 2025/0114870 A1 Apr. 10, 2025

(30) Foreign Application Priority Data
Oct. 10, 2023 (KR) .................. 10-2023-0134645

(51) Int. Cl.
*B23K 26/364* (2014.01)
*H10F 19/80* (2025.01)
*H10F 71/00* (2025.01)

(52) U.S. Cl.
CPC ......... *B23K 26/364* (2015.10); *H10F 19/804* (2025.01); *H10F 71/00* (2025.01)

(58) Field of Classification Search
CPC ...... B23K 26/364; H10F 19/804; H10F 71/00
(Continued)

(56) References Cited

U.S. PATENT DOCUMENTS 12,230,724 B2 * 2/2025 Smith ................. H10F 10/11
2011/0265841 A1 * 11/2011 Lee ..................... H10F 19/31
438/73

(Continued)

FOREIGN PATENT DOCUMENTS

CN 113199161 A 8/2021
JP 5585135 B2 9/2014
(Continued)

OTHER PUBLICATIONS

Notice of Allowance dated Jun. 4, 2024 issued in KR 10-2023-0134645.

*Primary Examiner* — Sarang Afzali
*Assistant Examiner* — Darrell C Ford
(74) *Attorney, Agent, or Firm* — Scully, Scott, Murphy & Presser, P.C.

(57) ABSTRACT

A solar panel disassembly device for disassembling a solar panel is provided. In the solar panel, a glass plate, an encapsulant, and a solar cell are stacked in sequence. The disassembly device includes: a stage on which a laser irradiation hole is formed; a transmissive panel disposed on the stage to cover the laser irradiation hole, forming a seating surface of the glass plate; a laser irradiation unit positioned in a lower portion of the stage, and formed such that a laser beam is irradiated through the laser irradiation hole to weaken or eliminate adhesion of the encapsulant as the laser beam passes through the transmissive panel and the glass plate to heat the encapsulant; and a scraper positioned in an upper portion of the stage and formed to scrape the solar cell stacked on the glass plate while moving from one side to the other side of the stage.

16 Claims, 11 Drawing Sheets

(58) Field of Classification Search
USPC .............................................. 29/426.1, 426.4
See application file for complete search history.

(56) References Cited

U.S. PATENT DOCUMENTS

2012/0270475 A1* 10/2012 Suter ....................... H10F 71/00
                                                    29/760
2015/0017878 A1*  1/2015 Luechinger ............. H10F 71/00
                                                    451/64

FOREIGN PATENT DOCUMENTS

| KR | 20190063539 A  | 6/2019  |
| KR | 102070204 B1   | 1/2020  |
| KR | 102176239 B1   | 11/2020 |
| KR | 102350630 B1   | 1/2022  |
| KR | 102364972 B1   | 2/2022  |

* cited by examiner

SOLAR PANEL DISASSEMBLY DEVICE AND SOLAR PANEL DISASSEMBLY METHOD USING THE SAME

CROSS REFERENCE TO RELATED APPLICATION

The present application claims priority to Korean Patent Application No. 10-2023-0134645, filed on Oct. 10, 2023, the entire contents of which are incorporated herein for all purposes by this reference.

BACKGROUND

Field

The present invention relates to a solar panel disassembly device and a solar panel disassembly method, and more particularly to a solar panel disassembly device and a solar panel disassembly method that are capable of cleanly separating and recovering a glass plate and a solar cell by weakening or eliminating the adhesion of an encapsulant.

Description of the Related Art

Solar power generation is a power generation method that converts sunlight directly into electrical energy using solar cells without the aid of a generator, and is one of the power generation methods to produce new renewable energy. In contrast to fossil fuels and nuclear power, this new renewable energy generation has the advantages of being able to be used on a semi-permanent basis because the new renewable energy generation is renewable, eco-friendly with no pollutants or carbon dioxide and radioactive emissions, and relatively evenly distributed on the planet compared to fossil fuels. In particular, solar power generation facilities are installed and used not only in various buildings and public facilities, but also in ordinary houses, apartments, and the like in Korea because they are pollution-free, can generate only the necessary amount of power at the required location, and are easy to maintain.

Research on improving the efficiency of solar modules has been actively conducted from the past to the present, and a large number of solar power generation devices have been installed. Therefore, the number of end-of-life solar panels is now increasing every year, and research is being conducted on the disposal of end-of-life solar panels. The lifespan of a solar panel, which forms the core of a solar power generation device, is about 20 to 30 years, and as the lifespan of solar panels in use around the world is coming to an end, the disposal of discarded solar panels is emerging as a very important issue. As the number of solar power generation devices is rapidly increasing, the number of solar power generation devices that have reached the end of their lifespan is expected to increase as well. Thus, the disposal of waste solar panels is emerging as a social issue.

Although the solar panel is made up of glass, aluminum, silicon, copper, silver, and the like, and each material can be recycled, most of the waste solar panels are currently landfilled and treated as simple waste. As described above, as the waste solar panel is treated as waste, the opportunity cost of recycling the materials is lost, and problems of environmental pollution are also raised. In particular, among each component that constitutes a solar panel, a solar cell includes materials such as silicon, copper, silver, and the like, which account for a significant price share of the total price of the solar panel. In this regard, the technology to separate and recover the solar cell from the solar panel is emerging as a very important issue. The solar cell is adhered to a glass plate through an Ethylene Vinyl Acetate (EVA) layer composed of an adhesive, and the technology to peel off the solar cell from the glass plate is a very important concern.

To this end, as disclosed in the related art "Korean Patent No. 10-2070204, Apparatus and method for separating front glass of waste solar cell module", an operator fixes a glass plate on a stage, and then peels off a solar cell from the glass plate through the movement of a scraper to recover the solar cell. However, when the solar cell is peeled off from the glass plate through a physical method according to the movement of the scraper, as described above, there are the following problems.

First, the conventional method of peeling off a solar cell has a problem in that during the process of peeling off the solar cell from a glass plate by a scraper, the solar cell is damaged due to the strong adhesion of an encapsulant, making it difficult to recover a good quality solar cell.

Second, the conventional method of peeling off a solar cell has a problem in that the encapsulant cannot be cleanly eliminated from the glass plate even after the solar cell is peeled off because of the strong adhesion of the encapsulant, and the encapsulant remains messy.

Third, the conventional method of peeling off a solar cell has a problem in that the load on the scraper increases towards the rear end of the glass plate due to the strong adhesion of the encapsulant when the solar cell is peeled off. Further, there is a problem in that the peeling equipment may be damaged due to the increased load on the scraper.

The documents of related art are as follows.
1. Korean Patent No. 10-2070204 (published on Jan. 29, 2020)
2. China Patent Publication No. 113199161 (published on Aug. 3, 2021)
3. Japanese Patent No. 5585135 (published on Sep. 10, 2014)

SUMMARY

The present invention has been made in an effort to solve the above-mentioned problem, and an object of the present invention is to provide a solar panel disassembly device and a solar panel disassembly method using the same that are capable of eliminating or weakening the adhesion of an encapsulant adhered to a glass plate of a solar panel so that a solar cell can be cleanly recovered from the glass plate.

To achieve the object of the present invention, disclosed herein is a solar panel disassembly device for disassembling a solar panel in the form in which a glass plate, an encapsulant (EVA), and a solar cell are stacked in sequence, the solar panel disassembly device comprising: a stage on which a laser irradiation hole is formed; a transmissive panel disposed on the stage to cover the laser irradiation hole, forming a seating surface of the glass plate; a laser irradiation unit positioned in a lower portion of the stage, and formed such that a laser beam is irradiated through the laser irradiation hole to weaken or eliminate an adhesion of the encapsulant as the laser beam passes through the transmissive panel and the glass plate to heat the encapsulant; and a scraper positioned in an upper portion of the stage and formed to scrape the solar cell stacked on the glass plate while moving from one side to the other side of the stage.

The laser irradiation hole may be provided in plurality and may be disposed spaced apart from each other at predetermined intervals from a front end to a rear end of the stage.

The laser irradiation hole may extend in the form of a long hole along a length direction from one side of the stage toward the other side of the stage, and may be arranged in plurality along a width direction of the stage.

Further, disclosed herein is a solar panel disassembly device for disassembling a solar panel in the form in which a glass plate, an encapsulant (EVA), and a solar cell are stacked in sequence, the solar panel disassembly device comprising: a stage provided with a panel receiving part recessed from a upper surface thereof with a predetermined depth, and a laser irradiation hole being underneath the panel receiving part and communicating with the panel receiving part; a transmissive panel disposed to be seated on a stepped portion of a lower end of the panel receiving part connected to the laser irradiation hole to cover the laser irradiation hole, and forming a seating surface of the glass plate; a laser irradiation unit positioned in a lower portion of the stage and formed such that a laser beam is irradiated through the laser irradiation hole to weaken or eliminate an adhesion of the encapsulant as the laser beam passes through the transmissive panel and the glass plate to heat the encapsulant; and a scraper positioned in an upper portion of the stage and formed to scrape the solar cell stacked on the glass plate while moving from one side to the other side of the stage.

The laser irradiation hole may be formed greater than an area of the glass plate, so that the laser irradiation unit may irradiate any area of the glass plate with a laser beam.

A guide may be installed on the upper surface of the stage along at least one side of the panel receiving part corresponding to a direction in which the solar panel is loaded.

The guide may be disposed to cover an edge of an upper portion of the transmissive panel.

The laser irradiation hole may be elongated on one side of the stage in a width direction, and formed such that the laser irradiation unit emits a laser beam to weaken or eliminate adhesion of the encapsulant positioned on a front side of the solar cell.

The laser irradiation unit may be configured to emit a laser beam while moving in the width direction of the laser irradiation hole.

The laser irradiation unit may be configured to be arranged in plurality along the width direction of the laser irradiation hole to emit a laser beam.

The transmissive panel may be formed of a material of one of tempered glass, polycarbonate, or acrylic.

The solar panel disassembly device may further include a pressing plate disposed on an upper side of the stage and formed to press an area of the solar panel, and a pressing unit provided with a heating member disposed on one side of the pressing plate to locally heat the area.

The solar panel disassembly device may further include a cooperating member extending upward and downwardly on at least one side of the stage, and being connected to the laser irradiation unit and the scraper, respectively.

The laser irradiation unit may be disposed ahead of the scraper, and the scraper may be configured to scrape the solar cell after the laser irradiation unit emits a laser beam to weaken or eliminate the adhesion of the encapsulant positioned on a front side of the scraper.

In addition, disclosed herein is a solar panel disassembly method for disassembling a solar panel in the form in which a glass plate, an encapsulant (EVA), and a solar cell are stacked in sequence, the solar panel disassembly method comprising: a first step in which the solar panel is transferred onto a seating surface of a transmissive panel disposed on a stage with the glass plate facing downward; and a second step in which an adhesion of the encapsulant is weakened or eliminated as a laser beam is irradiated by a laser irradiation unit disposed in a lower portion of the stage through a laser irradiation hole formed in the stage to pass through the transmissive panel and the glass plate to heat the encapsulant; and a third step in which a scraper disposed in an upper portion of the stage scrapes the solar cell whose adhesion to the glass plate has been weakened or eliminated by the laser irradiation unit.

In the solar panel disassembly method, a cooperation member may be further included extending upward and downward on at least one side of the stage, and being connected to the laser irradiation unit and the scraper, respectively, the laser irradiation unit may be positioned ahead of the scraper, and the scraper may scrape the solar cell after the laser irradiation unit emits a laser beam to weaken or eliminate the adhesion of the encapsulant positioned on a front side of the scraper.

The effects of the present invention obtained by the above-described solution are as follows.

First, the present invention has an effect of minimizing the damage to the solar cell during the disassembly of the solar cell from the glass plate, thus enabling the recovery of a good quality of solar cell.

Second, the present invention has an effect of cleanly removing the encapsulant from the glass plate during the solar cell disassembly process.

Third, the present invention has an effect of preventing contaminants (such as broken glass fragments) from being introduced into the laser irradiation hole.

Fourth, the present invention has an effect of reducing the load on the scraper, especially at the rear end of the glass plate where the load increases.

Fifth, the present invention has an effect of shortening an operation time and increasing operation productivity according to the shortening of the operation time, since the number of processes for the solar cell disassembly operation can be reduced.

DETAILED DESCRIPTION

Figure 1:
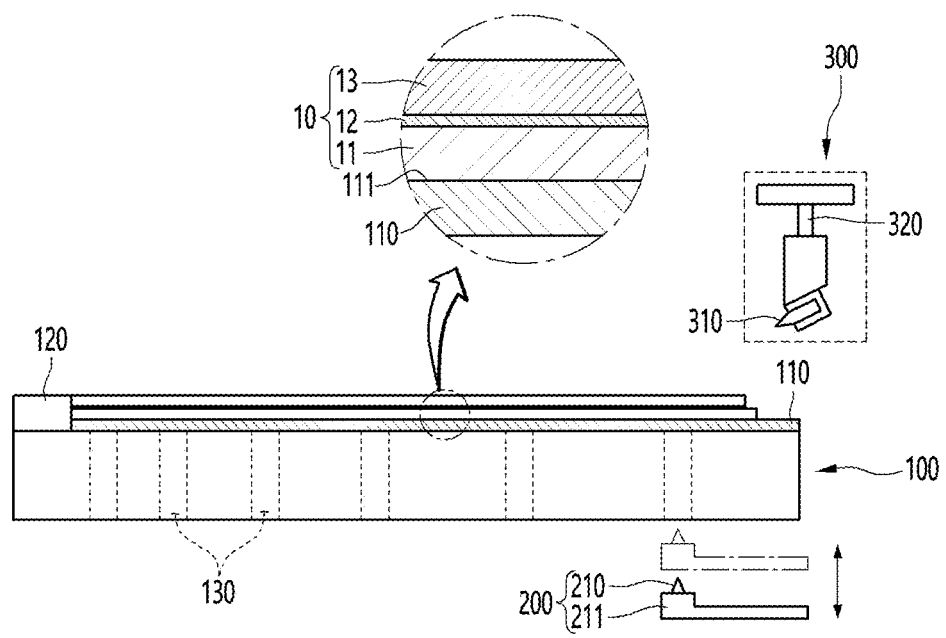
FIG. 1 is a conceptual view illustrating a solar panel disassembly device according to an embodiment of the present invention.

Hereinafter, a solar panel disassembly device and a solar panel disassembly method will be described in more detail with reference to the following drawings.

In the description of the embodiments disclosed in the present specification, the specific descriptions of publicly known related technologies will be omitted when it is determined that the specific descriptions may obscure the subject matter of the embodiments disclosed in the present specification.

It should be interpreted that the accompanying drawings are provided only to allow those skilled in the art to easily understand the exemplary embodiments disclosed in the present specification, and the technical spirit disclosed in the present specification is not limited by the accompanying drawings, and includes all alterations, equivalents, and alternatives that are included in the spirit and the technical scope of the present invention.

In the present specification, even different embodiments are given the same reference numerals for the same configuration, and redundant descriptions thereof are omitted.

Singular expressions include plural expressions unless clearly described as different meanings in the context.

In the present application, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof.

Figure 2:
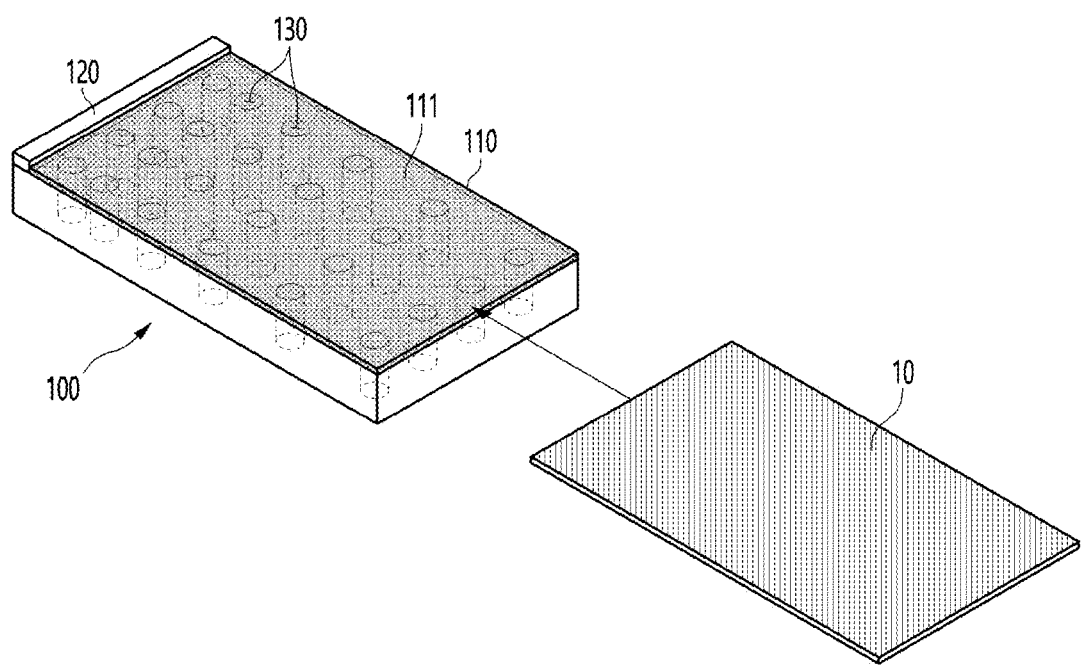
FIG. 2 is a perspective view of a stage illustrated in FIG. 1.
Figure 3:
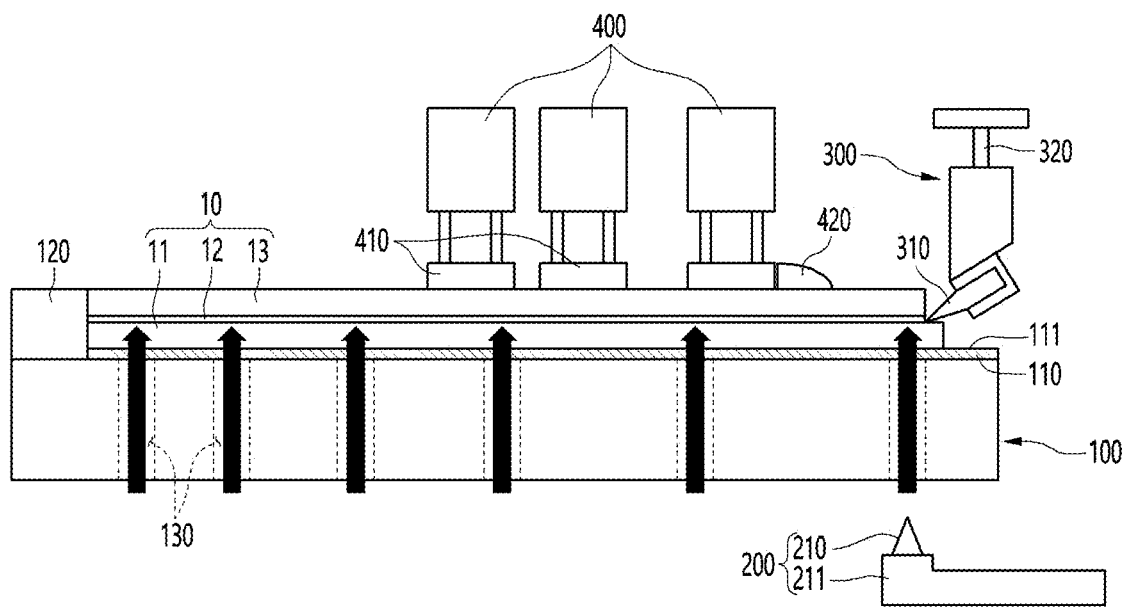
FIG. 3 is a conceptual view for describing a solar panel disassembly method using the solar panel disassembly device shown in FIG. 1.

FIG. 1 is a conceptual view illustrating a solar panel disassembly device according to an embodiment of the present invention, FIG. 2 is a perspective view of a stage illustrated in FIG. 1, and FIG. 3 is a conceptual view for describing a solar panel disassembly method using the solar panel disassembly device shown in FIG. 1.

With reference to FIGS. 1 to 3, a solar panel 10 has a form in which a glass plate 11, an encapsulant 12, and a solar cell 13 are stacked in sequence. The encapsulant 12, which is an adhesive means, is formed of ethylene-vinyl acetate (EVA), polyolefin elastomers (POE), thermoplastic polyurethane (TPU), silicone, ionomer, polyvinyl butyral (PVB), and the like.

A solar panel disassembly device includes a stage 100, a transmissive panel 110, a laser irradiation unit 200, and a scraper 300.

The stage 100 provides a space in which a solar panel disassembly operation is performed to peel off the solar cell 13 from the solar panel 10.

A laser irradiation hole 130 is formed in the stage 100 that passes through upper and lower portions of the stage 100. The laser irradiation hole 130 functions as a passage through which a laser beam emitted by the laser irradiation unit 200 positioned in the lower portion of the stage 100 may pass.

Therefore, the laser irradiation hole 130 may also be referred to as a laser irradiation path, laser irradiation passage or laser irradiation channel.

With respect to the stage 100, the present embodiment shows that the laser irradiation hole 130 having a form of a through hole is provided in plurality and arranged at a preset interval, but the present invention is not limited thereto. As will be described below, the laser irradiation hole 130 may be elongated in a front-to-rear direction of the stage 100 (see FIG. 5), may be elongated on the front side of the stage 100 in a left-to-right direction (see FIG. 6), and may have a form in which the panel receiving part 150 communicates with the laser irradiation hole 130 (see FIGS. 7 and 9).

The transmissive panel 110 is disposed on the stage 100 to cover the laser irradiation hole 130. An upper surface of the transmissive panel 110 forms a seating surface 111 on which the glass plate 11 of the solar panel 10 is seated. That is, in the disassembly operation of the solar panel 10, the solar panel 10 is seated on the seating surface 111 in a state with the glass plate 11 disposed facing downward.

The transmissive panel 110 may be made of a material that has high light transmittance and impact resistance, such as polycarbonate (PC), acrylic (polycarbonate/methyl methacrylic acid, PMMA), and tempered glass (TG). The transmissive panel 110 is disposed to cover the upper portion of the laser irradiation hole 130, which may prevent foreign objects such as glass fragments of the solar panel 10 from being introduced into the laser irradiation hole 130 and interfering with laser irradiation, and may prevent the glass plate 11 from being broken due to not being uniformly pressed when a blade 310 of the scraper 300 is seated, depending on the presence or absence of the laser irradiation hole 130.

Meanwhile, when a point at which the disassembly operation of the solar panel 10 starts is referred to as the front side of the stage 100, a stopper 120 may be installed on the rear side of the stage 100. The stopper 120 is configured to support a side surface of the rear side of the solar panel 10 during the disassembly operation of the solar panel 10 seated on the seating surface 111 of the transmissive panel 110, thereby preventing the solar panel 10 from being pushed rearward. To this end, the stopper 120 is preferably formed to protrude higher than the thickness of the glass plate 11 of the solar panel 10 seated on the seating surface 111 of the transmissive panel 110.

The laser irradiation unit 200 is positioned in the lower portion of the stage 100 and is configured such that a laser beam is irradiated through the laser irradiation hole 130. The laser beam emitted by the laser irradiation unit 200 sequentially passes through the transmissive panel 110 and the glass plate 11 through the laser irradiation hole 130, and is irradiated onto the encapsulant 12. The laser beam targeted at the encapsulant 12 is configured to heat the encapsulant 12, thereby weakening or eliminating the adhesion of the encapsulant.

The laser irradiation unit 200 may include a laser light source 210, and a fixing portion 211 on which the laser light source 210 is installed. A focus of the laser beam irradiated by the laser light source 210 may be adjustably configured.

The fixing portion 211 may be formed to be movable up and down, so that a distance from the stage 100 is adjustable. To this end, the fixing portion 211 may be installed to be lifted by a linear actuator. As described above, as the fixing portion 211 is configured to be movable up and down, the focus of the laser beam irradiated by the laser light source 210 may be moved up and down.

Alternatively, although not illustrated, the laser irradiation unit 200 may be configured to further include an optical system and a drive system. The optical system is a configuration for adjusting the focus of the laser beam by adjusting a distance from the laser light source 210, and includes at least one lens. In this case, adjusting the distance between the light source 210 and the optical system may be accomplished by the drive system. That is, the drive system is configured to adjust the focus of the laser beam by moving the optical system 220 away or closer relative to the light source 210.

The laser beam irradiated by the laser light source 210 has an appropriate wavelength to eliminate or weaken the adhesion of the encapsulant 12. A variety of laser beams can be used as the laser light source 210, such as a UV wavelength laser beam, a CO2 laser beam, or a YAG laser beam.

The scraper 300 is positioned in the upper portion of the stage 100 and is formed to scrape the solar cell 13 stacked on the glass plate 11 while moving from the front side to the rear side of the stage 100.

The scraper 300 includes the blade 310, and the blade 310 is configured to adjust the distance from the stage 100 through a lifting means 320. In the present embodiment, the lifting means 320 is shown configured as a linear actuator capable of upward and downward linear motion.

Meanwhile, the laser irradiation holes 130 may be formed to form a matrix along a length direction from the front side toward the rear side of the stage 100, and a width direction intersecting the length direction (i.e., the left-to-right direction), as illustrated in FIG. 2.

As described above, when the laser irradiation hole 130 is in the form of a through-hole, the laser irradiation unit 200 is formed to emit a laser beam at a position corresponding to the laser irradiation hole 130.

To this end, the laser irradiation unit 200 may be provided at each position corresponding to the laser irradiation hole 130.

Alternatively, the laser irradiation unit 200 may be configured to be movable from the front side to the rear side of the stage 100, and formed to irradiate emit a laser beam at a position corresponding to the laser irradiation hole 130. In this case, a plurality of laser irradiation units 200 are configured to be arranged left and right in correspondence to a first row of through hole, which is at the most front side of the stage 100, and to be movable to the rear side.

The laser irradiation holes 130 may be arranged equally spaced apart on the stage 100, but as illustrated, an interval between the laser irradiation holes 130 formed on the rear side of the stage 100 may be arranged narrower than an interval between the laser irradiation holes 130 formed on the front side of the stage 100. For reference, in this drawing, the interval between the laser irradiation holes 130 is shown to gradually narrow from the front end to the rear end of the stage 100.

This is a design that takes into account that the peeling load of the scraper 300 increases toward the rear end of the glass plate 11, and the interval between the laser irradiation holes 130 corresponding to the rear side of the solar panel 10 is further tightened to increase a portion where the adhesion of the encapsulant 12 is weakened or eliminated on the rear side of the solar panel 10, so as to be able to respond to the increased peeling load.

As illustrated in FIG. 3, the solar panel disassembly device may further include a pressing unit 400 that presses an area of the solar panel 10 seated on the seating surface 111 of the transmissive panel 110 to serve to prevent the solar cell 13 from moving during the scraping operation of the scraper 300, and to heat an area of the solar cell 13 to weaken or eliminate the adhesion of the encapsulant 12.

The pressing unit 400 is installed on the upper side of the stage 100, and is arranged in front of the scraper 300 with respect to the movement direction of the scraper 300 while the scraper 300 is performing the peeling operation, so as to move with the scraper 300 from the front side to the rear side of the stage 100.

The pressing unit 400 includes a pressing plate 410 and a heating means 420. The pressing plate 410 presses an area of the solar cell 13 that is adhered to the glass plate 11 and is installed so that the pressing plate 410 may be lowered from the top of the stage 100 toward the solar cell 13. In this case, the pressing unit 400 may be formed to sense pressure upon contact with the solar cell 13 and control a lowering range and a pressing force accordingly.

In this drawing, the bottom surface of the pressing plate 410 is shown to be formed flat, but the present invention is not limited thereto. The bottom surface of the pressing plate 410 may be provided with a roller, and the pressing plate 410 may move smoothly to the rear of the stage 100 with the movement of the scraper 300 through the rolling of the roller.

For reference, in this drawing, the pressing plate 410 is shown being provided in plurality, but the present invention is not limited thereto. The pressing plate 410 may be provided as a single piece.

The heating means 420 serves to locally heat an area of the solar cell 13 just before the scraper 300 peels off the solar cell 13 to further facilitate the scraping operation of the scraper 300. The heating means 420 is installed in a first pressing plate 410 of the plurality of pressing plates 410, which is positioned in front of the scraper 300. The heating means 420 may be any device capable of heating the solar cell 13, and may comprise an IR lamp (infrared lamp) or the like.

Hereinafter, an operation of peeling off the solar cell 13 from the glass plate 11 of the solar panel 10 using the solar panel disassembly device described above will be described.

First, a pretreatment process is performed to separate the components of the solar panel 10 before the solar cell 13 of the solar panel 10 is peeled off. In this process, an operation of separating and eliminating a frame or the like that constitutes the edge of the solar panel 10, an operation of cutting the leading edge of the solar cell 13 that is peeled off by the scraper 300, and the like are performed.

Next, a process of transferring the solar panel 10 with the pretreatment operation completed to the stage 100 with the glass plate 11 disposed facing downward proceeds (step 1). In this case, the glass plate 11 is seated on the seating surface 111 of the transmissive panel 110 positioned on the laser irradiation hole 130, and is in a close contact with the stopper 120 and is supported so that the glass plate 11 is not pushed to the rear side.

Next, the solar panel disassembly device is activated, and a process in which the laser irradiation unit 200 disposed on the lower portion of the panel 110 emits a laser beam through the laser irradiation hole 130 formed in the stage 100 proceeds (step 2). In this case, as the laser beam passes through the transmissive panel 110 and the glass plate 11 positioned on the laser irradiation hole 130 and heats the encapsulant 12, the adhesion of the encapsulant 12 is weakened or eliminated.

Next, a process in which the scraper 300 disposed in the upper portion of the stage 100 scrapes the solar cell 13 whose adhesion to the glass plate 11 is weakened or eliminated by the laser irradiation unit 200 proceeds (step 3).

In this case, the scraper 300 places the blade 310 disposed to be inclined between the boundaries of the glass plate 11 and the encapsulant 12 at the front end of the solar panel 10, and performs the peeling operation of the solar cell 13 while moving from the front side to the rear side of the stage 100.

Further, along with the scraping process described above, an operation of pressing and locally heating an area of the solar panel 10 to be scraped using the pressing unit 400 ahead of the scraper 300 may be performed.

Then, the solar cell 13 is peeled off from the glass plate 11 and recovered by the processes described above.

Next, the scraper 300 and the laser irradiation unit 200 are returned to the front side of the stage 100, and only the glass plate 11 is left on the stage 100.

Then, an operation of recovering the glass plate 11 is performed, and accordingly, the operation of peeling off the solar cell 13 from the glass plate 11 is completed.

Hereinafter, various modified examples in which some configurations of the solar panel disassembly device have been redesigned will be described.

Figure 4:
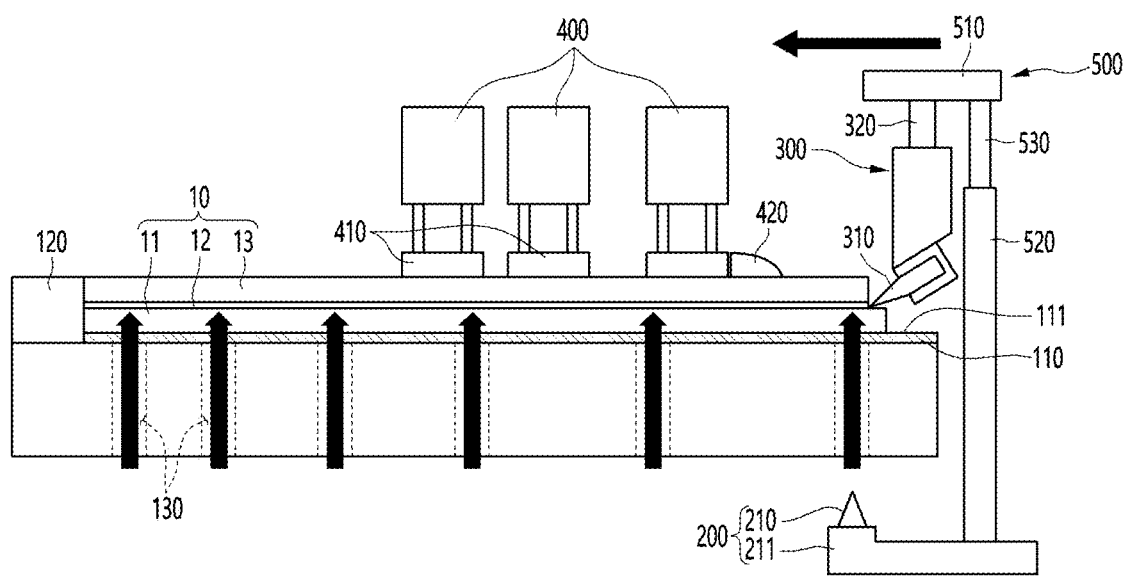
FIG. 4 is a conceptual view illustrating a solar panel disassembly device provided with a cooperation member according to another embodiment of the present invention.

FIG. 4 is a conceptual view illustrating a solar panel disassembly device provided with a cooperation member 500 according to another embodiment of the present invention.

With reference to FIG. 4, the solar panel disassembly device may further include a cooperation member 500 extending upward and downward on at least one side of the stage 100, and being connected to the laser irradiation unit 200 and the scraper 300, respectively.

The cooperating member 500 serves to simultaneously allow the movement of the scraper 300 and the laser irradiation unit 200 to be performed in parallel. The cooperating member 500 is configured to connect, on at least one side of the left and right sides of the stage 100, the laser irradiation unit 200 positioned on the lower portion of the stage 100 and the scraper 300 positioned on the upper portion of the stage 100.

The scraper 300 and the laser irradiation unit 200 are interconnected by the cooperating member 500, but the laser irradiation unit 200 is configured to be disposed ahead of the scraper 300 so that the operation of weakening or eliminating the adhesion of the encapsulant 12 by laser beam irradiation may be performed immediately prior to the scraping operation. In this case, the two operations may always be performed by the cooperating member 500 at a predetermined time interval.

The cooperating member 500 may comprise a linear actuator capable of lifting the scraper 300. Specifically, the cooperating member 500 may comprise a cylinder 520 and a piston rod 530, in which the piston rod 530 is installed to be lifted in an up-and-down direction relative to the cylinder 520. Accordingly, the scraper 300 may be simultaneously achieved to be lifted through the lifting means 320 and through the piston rod 530, so that the adjustment of the position of the scraper 300 relative to the stage 100 may be accomplished with more detail.

In this case, the upper end of the cooperating member 500 is provided with an installation table 510 on which the scraper 300 is installed, and the installation table 510 may be lifted toward the stage 100 through the lifting action of the piston rod 530, as described above.

The cylinder 520 and piston rod 530 described above may be disposed on at least one side of the stage 100. In addition, the cylinder 520 and the piston rod 530 are disposed on the left and right sides of the stage 100, respectively, and cooperate to implement a stable cooperation structure of the laser irradiation unit 200 and the scraper 300.

With this configuration of the cooperating member 500, it may be configured so that the scraper 300 scrapes the solar cell 13 immediately after the laser irradiation unit 200 emits a laser beam to weaken or eliminate the adhesion of the encapsulant 12 positioned on the front side of the scraper 300. Accordingly, even if the laser irradiation unit 200 and the scraper 300 move simultaneously, the scraper 300 may more smoothly peel off the solar cell 13 because the laser irradiation unit 200 first moves in a state in which the adhesion of the encapsulant 12 has been weakened or eliminated.

Figure 5:
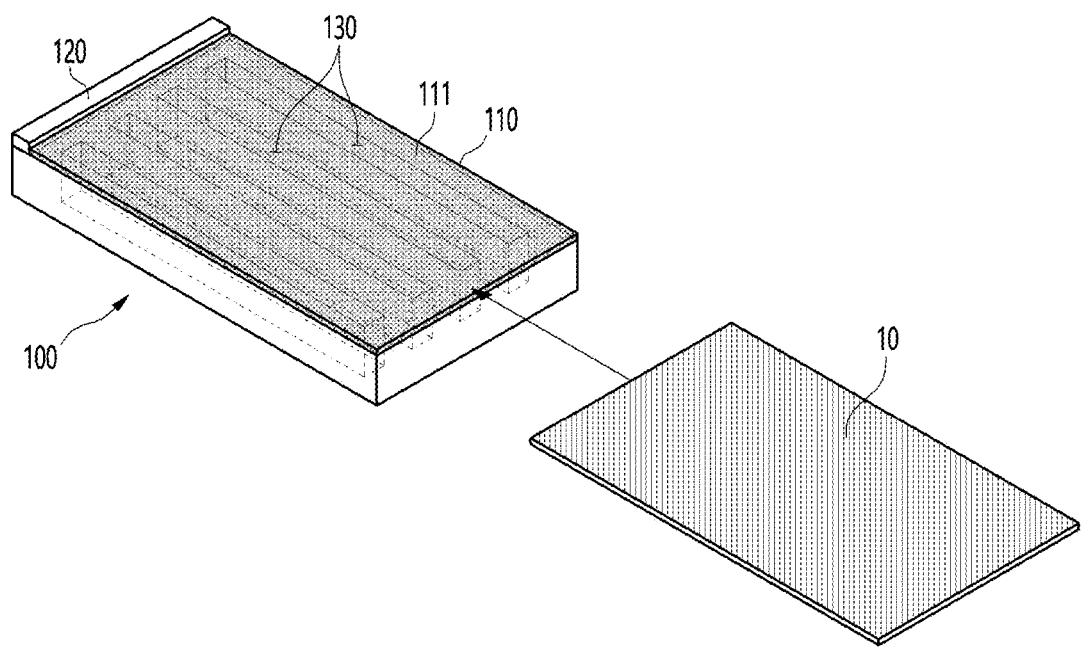
FIG. 5 is a perspective view illustrating a modified example of a stage in which a laser irradiation hole is elongated in a front-to-rear direction.

FIG. 5 is a perspective view illustrating a modified example of a stage in which a laser irradiation hole is elongated in a front-to-rear direction.

With reference to FIG. 5, the laser irradiation hole 130 may be formed to be elongated in the form of a long hole along the length direction from the front side to the rear side of the stage 100. The laser irradiation holes 130 in the form of a long hole are provided in plurality in a width direction of the stage 100.

As described above, when the laser irradiation hole 130 is made in the form of a long hole, the peeling operation may be performed while freely setting the laser beam irradiation position and the laser beam irradiation time interval of the laser irradiation unit 200. In this case, the laser beam irradiation time interval may be set to gradually become shorter as the laser irradiation unit 200 moves from the front side to the rear side of the stage 100.

Figure 6:
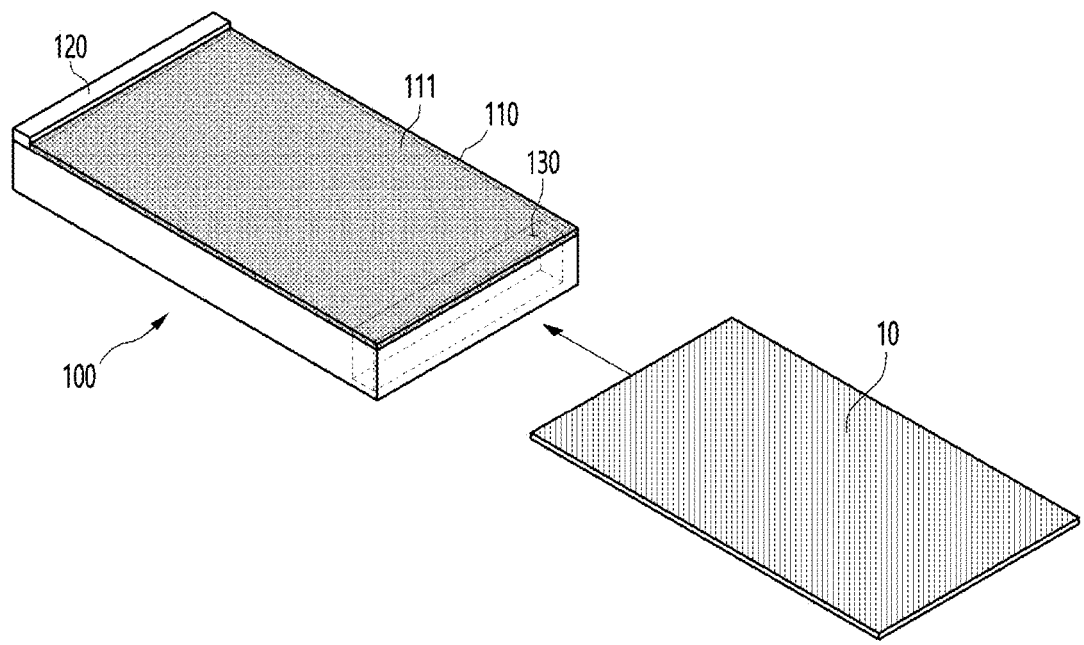
FIG. 6 is a perspective view illustrating another modified example of a stage with a laser irradiation hole elongated on a front side thereof in a left-to-right direction.

FIG. 6 is a perspective view illustrating another modified example of a stage with a laser irradiation hole elongated on a front side thereof in a left-to-right direction.

With reference to FIG. 6, the laser irradiation hole 130 may be elongated in the width direction (i.e., left-to-right direction) of the stage 100 on the front side of the stage 100 corresponding to a section where the blade 310 of the scraper 300 starts the peeling operation.

This is to ensure that the laser irradiation unit 200 intensively irradiates the encapsulant 12 positioned on the front side of the solar cell 13 with a laser beam to surely eliminate the adhesion of the front side encapsulant 12, so that a complete peeling may be achieved from the initial scraping of the blade 310.

Figure 10:
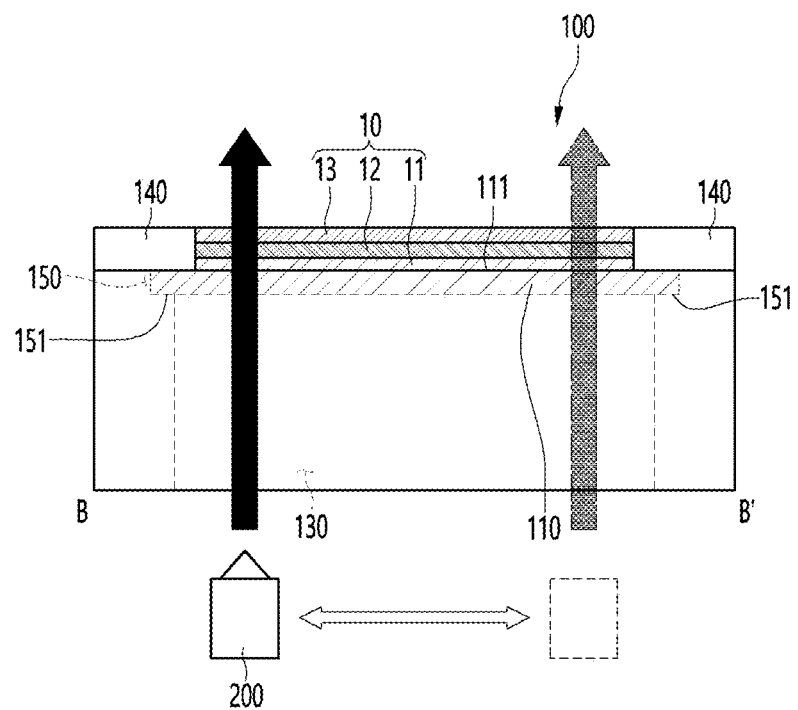
FIG. 10 is a conceptual view illustrating an example in which the laser irradiation unit is configured to be movable, in a cross-sectional view taken along line B-B' in FIG. 9.

In this case, the laser irradiation unit 200 may be configured to be a single piece and movable in the width direction along the laser irradiation hole 130 (see FIG. 10). That is, the laser irradiation unit 200 may be configured such that a laser beam is irradiated through the laser irradiation hole 130 while moving in the width direction, immediately before the solar cell 13 is peeled off by the scraper 300.

The laser irradiation unit 200 may be configured such that a laser beam is continuously or intermittently irradiated while moving in one direction, or may be configured such that a laser beam is continuously or intermittently irradiated while moving reciprocally from left to right.

Figure 11:
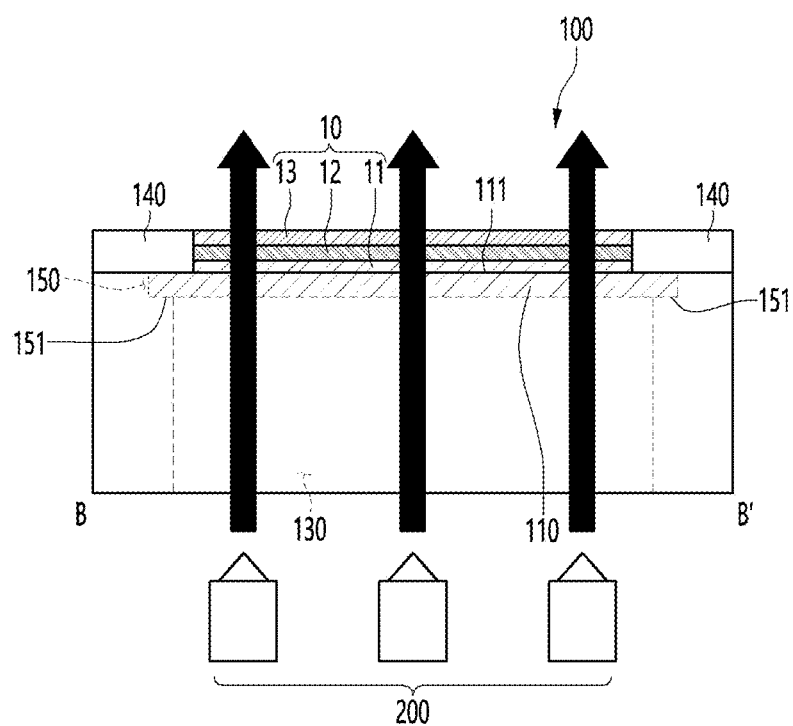
FIG. 11 is a conceptual view illustrating an example in which a plurality of laser irradiation units are provided, in a cross-sectional view taken along line B-B' in FIG. 9.

Alternatively, the laser irradiation unit 200 may be configured in plurality and arranged spaced apart at predetermined intervals along the width direction of the laser irradiation hole 130 (see FIG. 11). In this case, each laser irradiation unit 200 may be configured to be movable in the width direction within a predetermined range of the laser irradiation hole 130, so that a laser beam is continuously or intermittently irradiated while the laser irradiation unit 200 moves.

Figure 7:
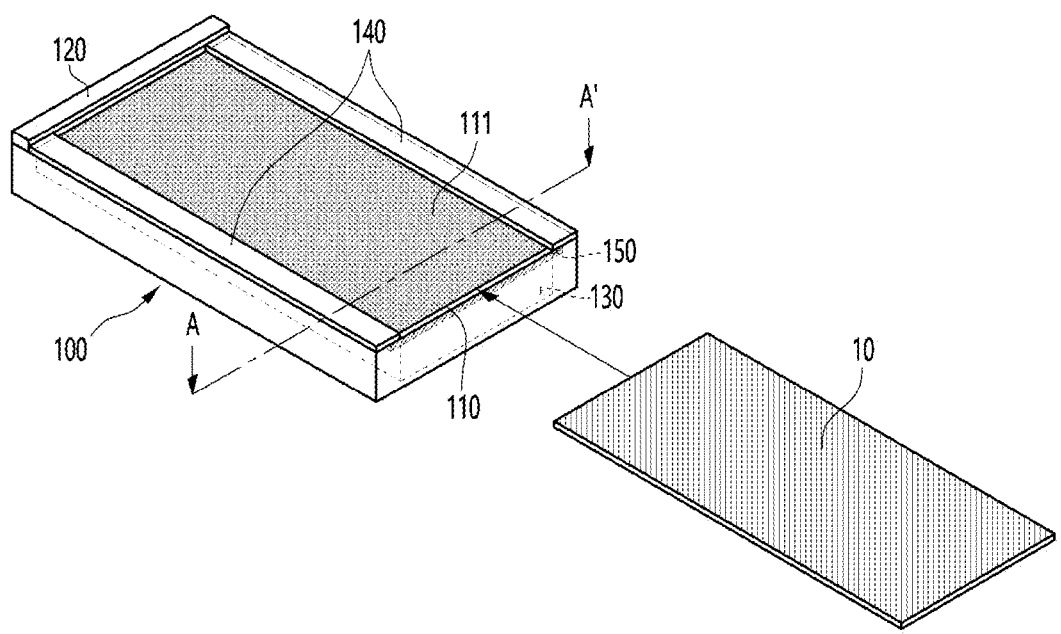
FIG. 7 is a perspective view illustrating still another modified example of a stage having a form in which a panel receiving part communicates with a laser irradiation hole.
Figure 8:
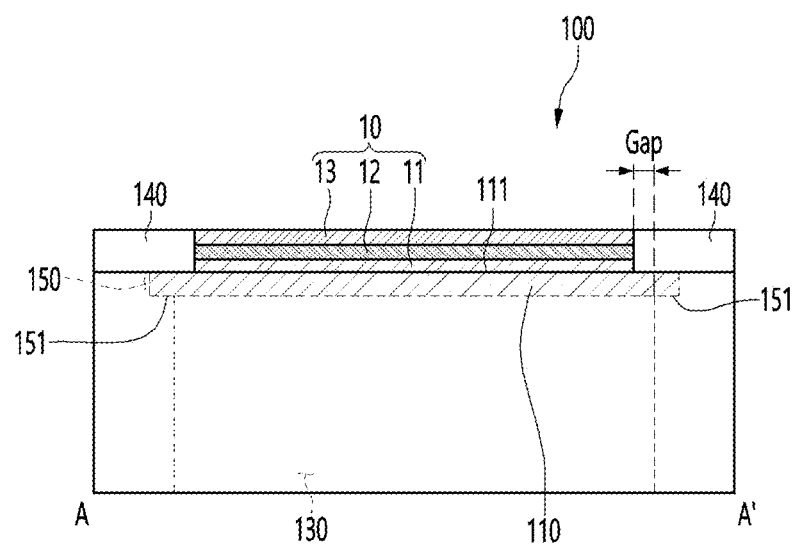
FIG. 8 is a cross-sectional view taken along line A-A' in FIG. 7.

FIG. 7 is a perspective view illustrating still another modified example of a stage 100 having a form in which a panel receiving part 150 communicates with a laser irradiation hole 130, and FIG. 8 is a cross-sectional view taken along line A-A' in FIG. 7.

With reference to FIGS. 7 and 8, the stage 100 is provided with a panel receiving part 150 recessed from the upper surface thereof with a predetermined depth to receive the transmissive panel 110, and the laser irradiation hole 130 being underneath the panel receiving part 150 and communicating with the panel receiving part 150.

In this modified example, the laser irradiation hole 130 is shown formed in the form of a large area opening that is greater than an area of the glass plate 11 so that the laser irradiation unit 200 may irradiate any area of the glass plate 11 with a laser beam. As described above, when the laser irradiation hole 130 is formed extending outward from the end of the glass plate 11 by a predetermined gap or more, it is possible that laser beam irradiation may be freely performed on the entire area of the glass plate 11 while freely setting the laser irradiation position and the laser irradiation time interval of the laser irradiation unit 200.

Meanwhile, a width of the laser irradiation hole 130 is formed narrower than a width of the panel receiving part 150. With this difference in width, a stepped portion 151 protruding inward is formed at the lower end of both sides of the panel receiving part 150. With the structure described above, the transmissive panel 110 is disposed to be seated on the stepped portion 151 of the lower end of the panel receiving part 150, which is connected to the laser irradiation hole 130, to cover the laser irradiation hole 130.

The seating surface 111 is formed on the upper surface of the transmissive panel 110 to allow the glass plate 11 of the solar panel to be seated with the glass plate 11 disposed facing downward. The upper surface of the transmissive panel 110 may be disposed to be coplanar with the upper surface of the stage 100.

Meanwhile, a guide 140 may be installed on the upper surface of the stage 100 along at least one side of the panel receiving part 150 corresponding to a direction in which the solar panel 10 is loaded. In this drawing, the guide 140 is shown installed on each of the left and right sides of the panel receiving part 150. In this case, the installation position of the solar panel 10 may be limited by the guides 140 on the left and right sides and the stopper 120. The guide 140 may be configured to be movable in the left-to-right direction to allow customized settings for the solar panels 10 having different widths.

The guide 140 may be disposed to cover an edge of the upper portion of the transmissive panel 110. When the area of the laser irradiation hole 130 is formed larger than the area of the solar panel 10, the guide 140 may be formed to protrude inward than the laser irradiation hole 130, thereby limiting a laser irradiation area. The guide 140 may be formed of, or coated with, a material that absorbs the laser beam being irradiated or is not damaged by the laser beam being irradiated.

Figure 9:
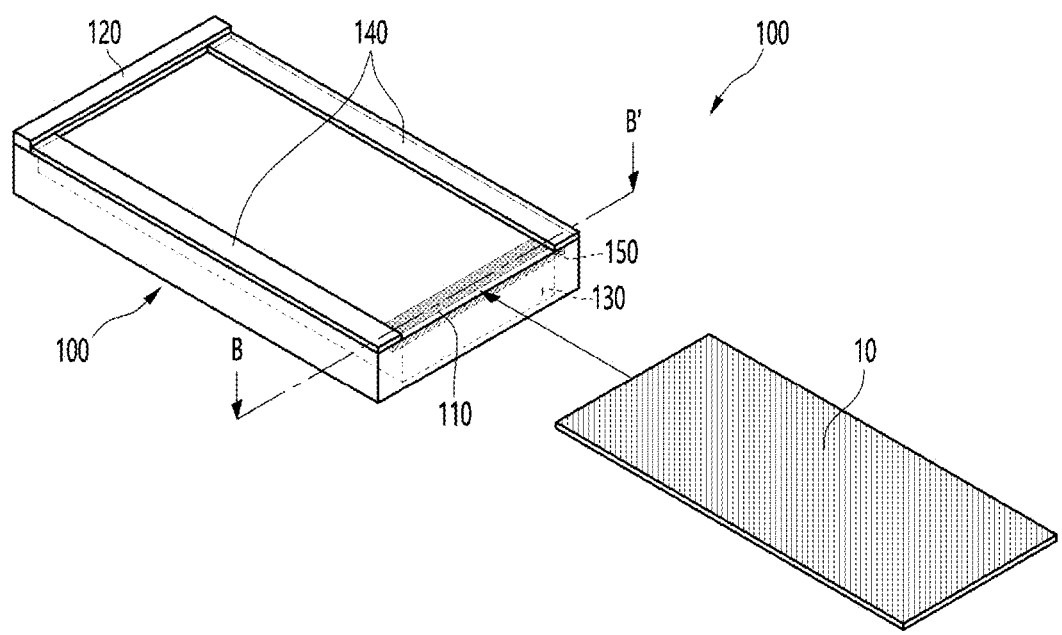
FIG. 9 is a perspective view illustrating still another modified example of a stage having a form in which a panel receiving part communicates with a laser irradiation hole, but the laser irradiation hole is elongated on the front side only in a left-to-right direction.

FIG. 9 is a perspective view illustrating still another modified example of the stage 100 having a form in which the panel receiving part 150 communicates with the laser irradiation hole 130, but the laser irradiation hole 130 is elongated on the front side only in a left-to-right direction.

Unlike the modified examples in FIGS. 7 and 8 described above, in this modified example, the laser irradiation hole 130 is elongated in the width direction (i.e., left-to-right direction) of the stage 100 on the front side of the stage 100 corresponding to a section where the blade 310 of the scraper 300 starts the peeling operation.

This is to ensure that the laser irradiation unit 200 intensively irradiates the encapsulant 12 positioned on the front side of the solar cell 13 with a laser beam to surely eliminate the adhesion of the front side encapsulant 12, so that a complete peeling may be achieved from the initial scraping of the blade 310.

For reference, the panel receiving part 150 has the form of a groove with a large area extending from the front side to the rear side of the stage 100, the same as in the modified examples in FIGS. 7 and 8 described above. Structurally, the panel receiving part 150 is only in communication with the laser irradiation hole 130 formed on the front side of the stage 100.

Meanwhile, FIG. 10 is a conceptual view illustrating an example in which the laser irradiation unit is configured to be movable, in a cross-sectional view taken along line B-B' in FIG. 9, and FIG. 11 is a conceptual view illustrating an example in which a plurality of laser irradiation units are provided, in a cross-sectional view taken along line B-B' in FIG. 9.

With reference to FIG. 10, the laser irradiation unit 200 may be configured to be a single piece and movable in the width direction along the laser irradiation hole 130. That is, the laser irradiation unit 200 may be configured such that a laser beam is irradiated through the laser irradiation hole 130 while moving in the width direction, immediately before the solar cell 13 is peeled off by the scraper 300.

The laser irradiation unit 200 may be configured such that a laser beam is continuously or intermittently irradiated while moving in one direction, or may be configured such that a laser beam is continuously or intermittently irradiated while moving reciprocally from left to right.

With reference to FIG. 11, the laser irradiation unit 200 may be configured in plurality and arranged spaced apart at predetermined intervals along the width direction of the laser irradiation hole 130. In this case, each laser irradiation unit 200 may be configured to be movable in the width direction within a predetermined range of the laser irradiation hole 130, so that a laser beam is continuously or intermittently irradiated while the laser irradiation unit 200 moves.

What is claimed is:

1. A solar panel disassembly device for disassembling a solar panel, the solar panel comprising a glass plate, an encapsulant, and a solar cell stacked in sequence, the solar panel disassembly device comprising:
    a stage on which a laser irradiation hole is formed;
    a transmissive panel disposed on the stage to cover the laser irradiation hole;
    a laser light source positioned in a lower portion of the stage, and configured to emit a laser beam through the laser irradiation hole to weaken or eliminate adhesion of the encapsulant as the laser beam passes through the transmissive panel and the glass plate to heat the encapsulant; and
    a scraper configured to scrape the solar cell stacked on the glass plate while moving from one side to another side of the stage.

2. The solar panel disassembly device of claim 1, further comprising a plurality of the laser irradiation hole disposed spaced apart from each other at predetermined intervals from a front end to a rear end of the stage.

3. The solar panel disassembly device of claim 1,
    wherein the laser irradiation hole extends along a length direction of the stage, and
    wherein the solar panel disassembly device further comprises a plurality of the laser irradiation hole arranged along a width direction of the stage.

4. A solar panel disassembly device for disassembling a solar panel, the solar panel comprising a glass plate, an encapsulant, and a solar cell stacked in sequence, the solar panel disassembly device comprising:

a stage provided with a panel receiving surface recessed from an upper surface of the stage with a predetermined depth, and a laser irradiation hole underneath the panel receiving surface and communicating with the panel receiving surface;

a transmissive panel disposed to be seated on a stepped portion of a lower end of the panel receiving surface connected to the laser irradiation hole to cover the laser irradiation hole;

a laser light source positioned in a lower portion of the stage, and configured to emit a laser beam through the laser irradiation hole to weaken or eliminate adhesion of the encapsulant as the laser beam passes through the transmissive panel and the glass plate to heat the encapsulant; and a scraper configured to scrape the solar cell stacked on the glass plate while moving from one side to another side of the stage.

5. The solar panel disassembly device of claim 4, wherein the laser irradiation hole has a cross-sectional area greater than an area of the glass plate so that the laser light source is able to irradiate any part of the glass plate with the laser beam through the laser irradiation hole.

6. The solar panel disassembly device of claim 5, further comprising a guide installed on the upper surface of the stage along at least one side of the panel receiving surface, wherein the guide is configured to guide the solar panel onto the panel receiving surface of the stage.

7. The solar panel disassembly device of claim 6, wherein the guide is disposed to cover an edge of an upper portion of the transmissive panel.

8. The solar panel disassembly device of claim 4, wherein the laser irradiation hole is elongated along an edge of the stage in a width direction of the stage.

9. The solar panel disassembly device of claim 8, wherein the laser light source is configured to be moved in the width direction of the stage and to emit the laser beam through the laser irradiation hole while being moved in the width direction of the stage to weaken or eliminate the adhesion of the encapsulant on a front side of the solar cell positioned over the laser irradiation hole.

10. The solar panel disassembly device of claim 8, further comprising a plurality of the laser light source arranged along the width direction of the stage, wherein each of the plurality of the laser light source is configured to emit the laser beam through the laser irradiation hole.

11. The solar panel disassembly device of claim 4, wherein the transmissive panel is formed of a material of one of tempered glass, polycarbonate, or acrylic.

12. The solar panel disassembly device of claim 11, further comprising:
a pressing plate disposed on an upper side of the stage and configured to press an area of the solar panel; and
a heater disposed on one side of the pressing plate and configured to locally heat the area of the solar panel.

13. The solar panel disassembly device of claim 12, further comprising:
a connector connected to the laser light source and the scraper, configured to move the laser light source and the scraper simultaneously.

14. The solar panel disassembly device of claim 13, wherein the connector is connected to the laser light source and the scraper to dispose the laser light source ahead of the scraper such that, as the connector moves the laser light source and the scraper simultaneously, the scraper is configured to scrape the solar cell after the laser light source emits the laser beam to weaken or eliminate the adhesion of the encapsulant positioned on a front side of the scraper.

15. A solar panel disassembly method for disassembling a solar panel comprising a glass plate, an encapsulant, and a solar cell are stacked in sequence, the solar panel disassembly method comprising:
transferring the solar panel onto a transmissive panel disposed on a stage with the glass plate facing downward;
emitting, by a laser light source disposed in a lower portion of the stage, a laser beam through a laser irradiation hole formed in the stage to pass through the transmissive panel and the glass plate to heat the encapsulant to thereby weaken or eliminate adhesion of the encapsulant; and
scraping, by a scraper, the solar cell whose adhesion to the glass plate has been weakened or eliminated by the laser beam emitted by the laser light source.

16. The solar panel disassembly method of claim 15,
wherein a connector is connected the laser light source and the scraper,
wherein the laser light source is positioned ahead of the scraper, and
wherein the solar panel disassembly method further comprises:
moving, by the connector, the laser light source and the scraper simultaneously, and scraping, by the scraper, the solar cell after the laser light source emits the laser beam to weaken or eliminate the adhesion of the encapsulant positioned on a front side of the scraper.

* * * * *